United States Patent [19]

Engeler et al.

[11] Patent Number: 5,047,769

[45] Date of Patent: Sep. 10, 1991

[54] METHODS OF CORRECTING DATA CONVERSION/TRANSFER ERRORS IN A VIBRATORY ENERGY IMAGING SYSTEM UTILIZING A PLURALITY OF CHANNELS

[75] Inventors: William E. Engeler, Scotia; Matthew O'Donnell, Schenectady; John J. Bloomer, Schenactady; John T. Pedicone, Schenactady, all of N.Y.

[73] Assignee: General Electric Company, Schenectady, N.Y.

[21] Appl. No.: 518,596

[22] Filed: May 3, 1990

[51] Int. Cl.[5] ............................................. H03M 1/06
[52] U.S. Cl. .................................... 341/118; 341/140
[58] Field of Search ............... 341/118, 120, 155, 106, 341/119, 121, 122, 124, 125, 138, 140, 141; 364/571.7, 571.5, 571.4, 571.1; 371/16.1

[56] References Cited

U.S. PATENT DOCUMENTS

| | | | |
|---|---|---|---|
| 4,839,652 | 6/1989 | O'Donnell et al. | 341/122 |
| 4,896,282 | 1/1990 | Orwell | 364/571.05 |
| 4,903,026 | 2/1990 | Tiemann et al. | 341/131 |
| 4,983,970 | 1/1991 | O'Donnell et al. | 341/122 |

Primary Examiner—A. D. Pellinen
Assistant Examiner—Brian K. Young
Attorney, Agent, or Firm—Marvin Snyder; James C. David, Jr.

[57] ABSTRACT

A method for correcting data conversion/transfer errors in each of a plurality N of channels of a vibratory energy imaging system, by: providing an addressable memory having a plurality $L=2^M$ locations, each for storage of a data word of B bits; then storing in each of the L locations of the memory means a B-bit data word having a value selected to cause the output-to-input transfer function for that channel to assume a desired relationship, with respect to a standard transfer measure; and selecting that one of the L data word locations, responsive to that actual one of an M-bit data word output from a channel ADC or from a data bus, responsive to a test signal, in which to place corresponding data.

8 Claims, 3 Drawing Sheets

METHODS OF CORRECTING DATA CONVERSION/TRANSFER ERRORS IN A VIBRATORY ENERGY IMAGING SYSTEM UTILIZING A PLURALITY OF CHANNELS

BACKGROUND OF THE INVENTION

The present invention relates to coherent imaging systems using vibratory energy, such as ultrasonic or electromagnetic waves, and, more particularly, to novel methods for facilitated correction of errors in data conversion, data transfer and the like functions in a vibratory energy imaging system.

Methods and apparatus for fully digital beam formation in phase-array coherent imaging systems are now well known; one such system, for use in ultrasonic medical imaging and the like, is described and claimed in U.S. Pat. No. 4,839,652, issued June 13, 1989, assigned to the assignee of the present application and incorporated herein in its entirety by reference. Such an imaging system utilizes a phased array sector scanner (PASS) to rapidly and accurately sweep a formed beam of vibratory energy. The desired beam pointing accuracies are obtained by maintaining an accurate set of phase relationships, which are, in fact, a set of time delays between the various ones of a plurality N of transducer elements of the PASS array. By decoupling the required phase accuracy and time delay accuracy from one another, the signals can be coherently summed with greater accuracy. However, proper beam formation requires that both the necessary time resolution and amplitude resolution be provided in each channel, so that the at least one analog-to-digital converter (ADC, utilized for converting the analog RF signal from each channel transducer, at any instant, into a digital data word for processing) in each channel carry out conversions at a sample frequency of at least two times, and usually four times, the maximum operating imager frequency. In an ultrasonic medical imager utilizing signals of up to 10 MHz, each of the N channels (where N is presently on the order of 64) requires the use of at least one ADC of 7 or 8 bit output resolution, and operates at a 20 or 40 MHz sampling rate; those skilled in the art will immediately utilize that seven or eight bit ADC resolution is insufficient to provide the at least 70 dB of instantaneous dynamic range required in each channel of the imaging system. A method and apparatus for utilizing a linear ADC of lesser resolution for realizing a large imaging system dynamic range is described and claimed in co-pending application Ser. No. 207,532, filed June 16, 1988,/ now U.S. Pat. No.5,005,419 assigned to the assignee of the present invention and also incorporated here in its entirety by reference. In the invention of that application, predetermined nonlinearity is provided in front of the linear ADC, to compress the analog signal prior to conversion to a digital data word; the digital data word is then further processed in accordance with another non-linear mathematical function which is selected to be the inverse (expansion) of the previously-employed mathematical (compressive) function, so that the value of the expanded digital data words are again linearly related to the value of the input analog RF (echo) signal voltages provided to the input of the compressive amplifier. The inverse (expansion) non-linear relationship may be provided in the ADC itself, or may be provided in a subsequent stage, which may utilize a look-up table approach. The latter approach is particularly desirable if a compression amplifier approximates a power law function and a static-random-access-memory (SRAM) circuit provides an output signal which preserves both the input sign and the inverse power law exponent. For example, utilizing an ADC with a 7-bit-wide output data word, in a system requiring an 11-bit-wide data word for realization of the required instantaneous dynamic range, the power law (i.e. $\log(V_{out}) = k \log(V_{in})$) results in $k=0.6$ for the compressive stage, and an expansion stage constant $k' = 1/k = 5/3$.

While the method for operation of the abovedescribed subsystem (i.e. compression analog amplifier, ADC and expansion, digital random access memory (RAM) look-up remap stage) allows the instantaneous system dynamic range to be increased to the desired level, utilizing the preselected nonlinear compressive/expansive complementary functions, we have found that other methods can be utilized with a wide range of channel apparatus to allow the same inversion function to be provided simultaneously with the ability to remove many other system nonlinearities, and to also both remove certain classes of nonlinearities generated by imperfections in the apparatus of each of the plurality N of channels in the system and correct for channel-to-channel differences. Thus, it is highly desirable to provide methods for achieving simultaneous multiple functions, including inverse dynamic range decompression correction of ADC and other channel nonlinearities, and for correcting channel-to-channel gain differences and the like functions in each of a plurality of channels of an imaging system.

BRIEF SUMMARY OF THE INVENTION

In accordance with the invention, a method for correcting data conversion/transfer errors in each of a plurality N of channels of a vibratory energy imaging system includes the steps of: providing an addressable memory having a plurality $L=2^M$ locations, each for storage of a data word of B bits; storing in each of the L locations of the memory means a B-bit data word having a value selected to cause a desired relationship (e.g. to linearize) the output-to-input transfer function for that channel, with respect to a standard transfer measure; and selecting that one of the L data word locations, responsive to that actual one of an M-bit data word output from a channel ADC or from a data bus, responsive to a test signal, in which to place corresponding data. The analog RF signal from each channel transducer, having been compressed prior to analog-to-digital conversion to map the large instantaneous dynamic range of the channel signal into the dynamic range of the M-bit ADC, is operated upon, or remapped, by an inverse (expansion) function to return the digital data of the ADC output to a linear scale, so that a linear filtering chain can be used to form the coherent sum across the system aperture; the remap SRAM accounts for analog gain variations (including ADC conversion variations) between the different channels of the system, by reference to a test signal generator for providing the actual transfer function for that channel's analog front-end circuitry. The M-bit ADC out signal is utilized to input an SRAM memory location in which is stored data providing a digital data word which is related in the desired manner (e.g. linearly) to the analog RF value causing the M-bit data word addressing that location, so that the output data for all selected analog values is the same in each of N channels. A memory load signal gounting means to sequentially address the memory facilitating loading of the memory data words, upon startup and/or recalibration of the system channels.

In a presently preferred embodiment of our novel method, each of N=128 channels (with a similar front-end portion, each having a compression amplifier, a single ADC, a digital demodulator and rate-reduction means—including a digital demodulator means, digital low-pass filtering means, digital decimation means, digital delay means and the like—and channel control logic means, which can all be separate or can be integrated into a semiconductor monolithic circuit, if desired) are all operated in like manner, to obtain a desired transfer function therein.

The foregoing invention will be described with particular emphasis to one energy form, e.g. ultrasonic mechanical vibrations, in a presently preferred embodiment; it should be understood that this energy form is exemplary and not delimiting.

Accordingly, it is an object of the present invention to provide a novel method for correcting data conversion and/or data transfer errors in each of a plurality of channels providing a digital baseband representation of a received vibratory energy beam.

This and other objects of the present invention will become apparent to those skilled in the art upon reading of the following detailed description of the invention, when considered in conjunction with the appended drawings.

DETAILED DESCRIPTION OF THE INVENTION

Figure 1:
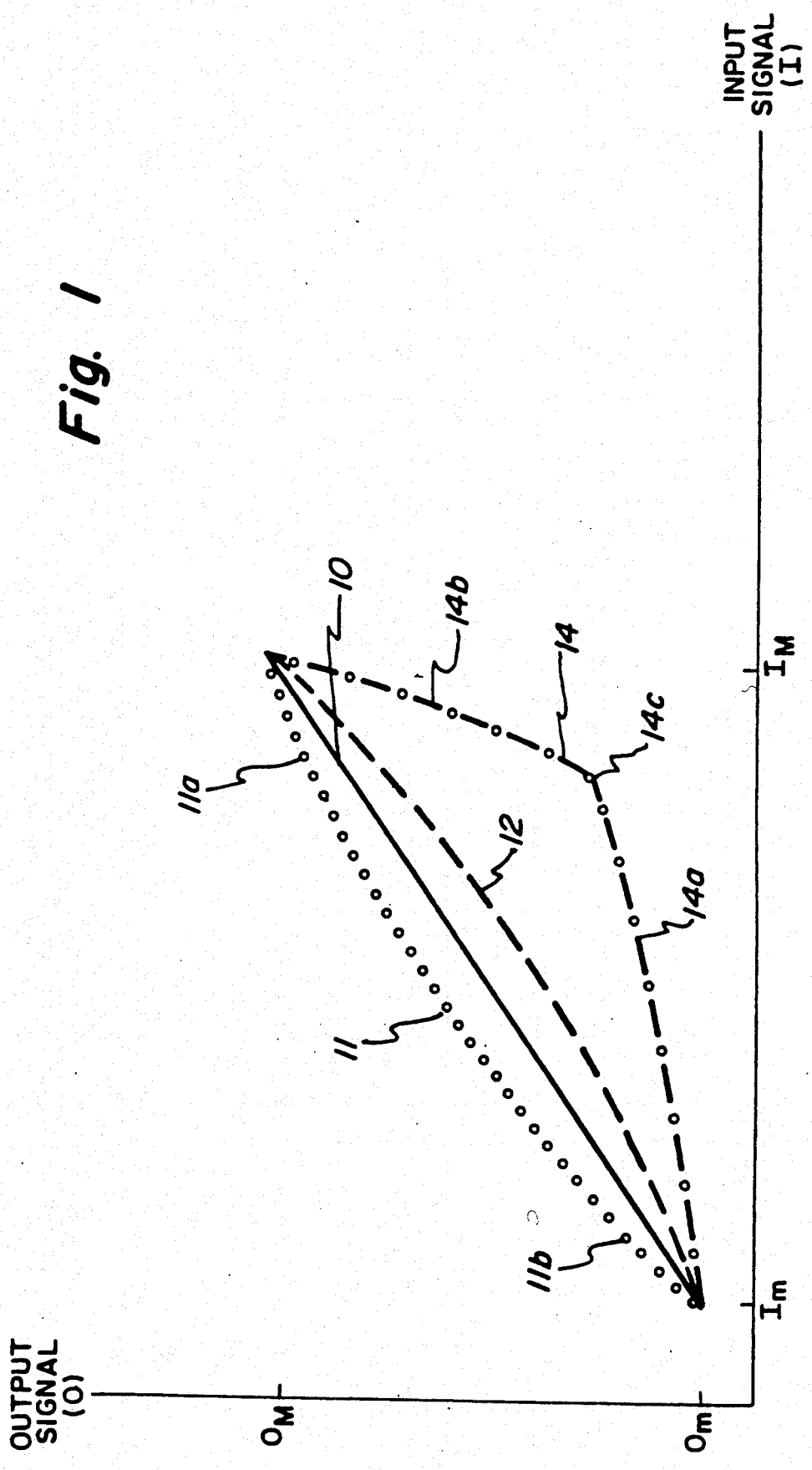
FIG. 1 is a graph illustrating the desired linear input/output relationship, and various non-linear signal relationships engended by various causes during the operation of each system channel.

Referring initially to FIG. 1, a graph is shown in which amplitude of an input signal I is plotted along the abscissa, from a minimum input amplitude $I_m$ to a maximum input amplitude $I_M$, and amplitude of an output signal O appears along the ordinate, from a minimum output amplitude $O_m$ to a maximum output amplitude $O_M$. An ideal channel transfer function is graphed by solid line 10, as a straight line representing a linear analog RF signal input-to-output data relationship. In order to solve the instantaneous dynamic range problem, analog compression prior to the ADC utilizes a non-linear function, as shown by the dotted-line 11 transfer function, so that relatively large changes in input amplitude near the maximum $I_M$ portion 11a provide the same magnitude of output change as would be provided by much smaller input changes near the minimum input $I_m$ portion 11b of the curve. This compression function is later corrected for by the use of the non-linear inverse relationship illustrated by the broken-line curve 12. One example uses the function log O = k log I, where k is about 0.6, for curve 11; the opposite curve 12 would utilize a constant k' of 5/3. The foregoing is now known to those skilled in the art. Also known is the presence of other unwanted nonlinearities in each channel. Due to nonlinearities in the ADC, compression amplifier and/or other analog circuits in the front-end of each channel, some arbitrarily non-linear transfer curve, such as the chain-line curve 14 may actually occur; curve 14 has a plurality of segments (here a pair of segments 14a and 14b) which may themselves be non-linear, and may have rather abrupt breakpoints (such as the breakpoint 14c) therebetween.

In accordance with a first principle of the present invention, we have found that, whatever the actual functional block configuration of the channel, the various analog nonlinearities and channel-to-channel analog differences (such as in the various gains, compression points and the like) can be substantially removed by recording the digital data output signal, which should ideally linearly correspond to a given analog RF input signal, and providing the final digital data word from storage whenever the ADC output digital data provides a corresponding value, as a memory addressing function. Thus, any monotonic transfer (i.e. input-to-output) function 14 can be converted to a function 10 with a desired degree of linearity.

Figure 2A:
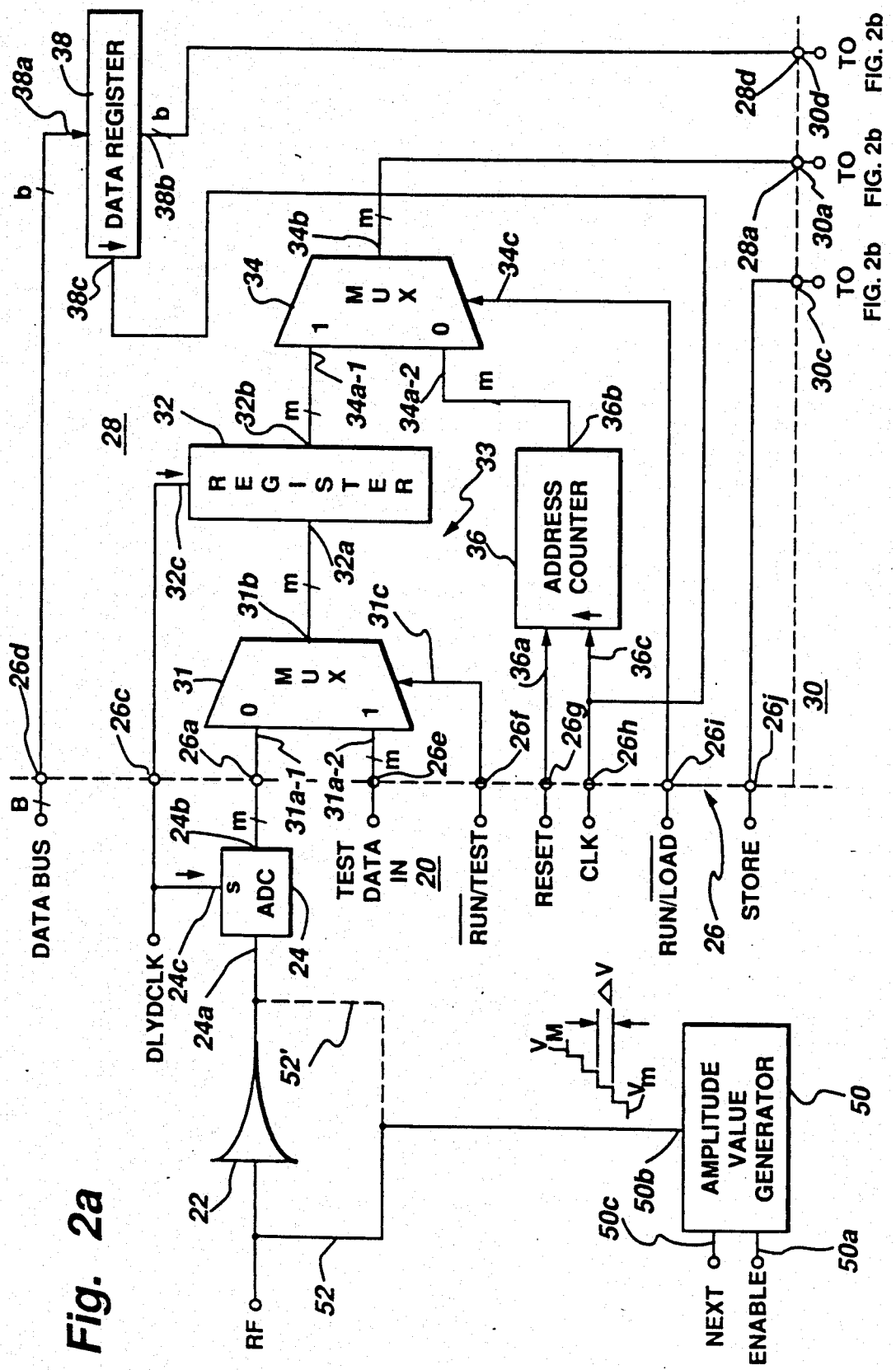
FIGS. 2a and 2b together make up a schematic block diagram of one form of apparatus, forming a portion of each of the N channels of an imaging system, with which the method of the present invention can be used.
Figure 2B:
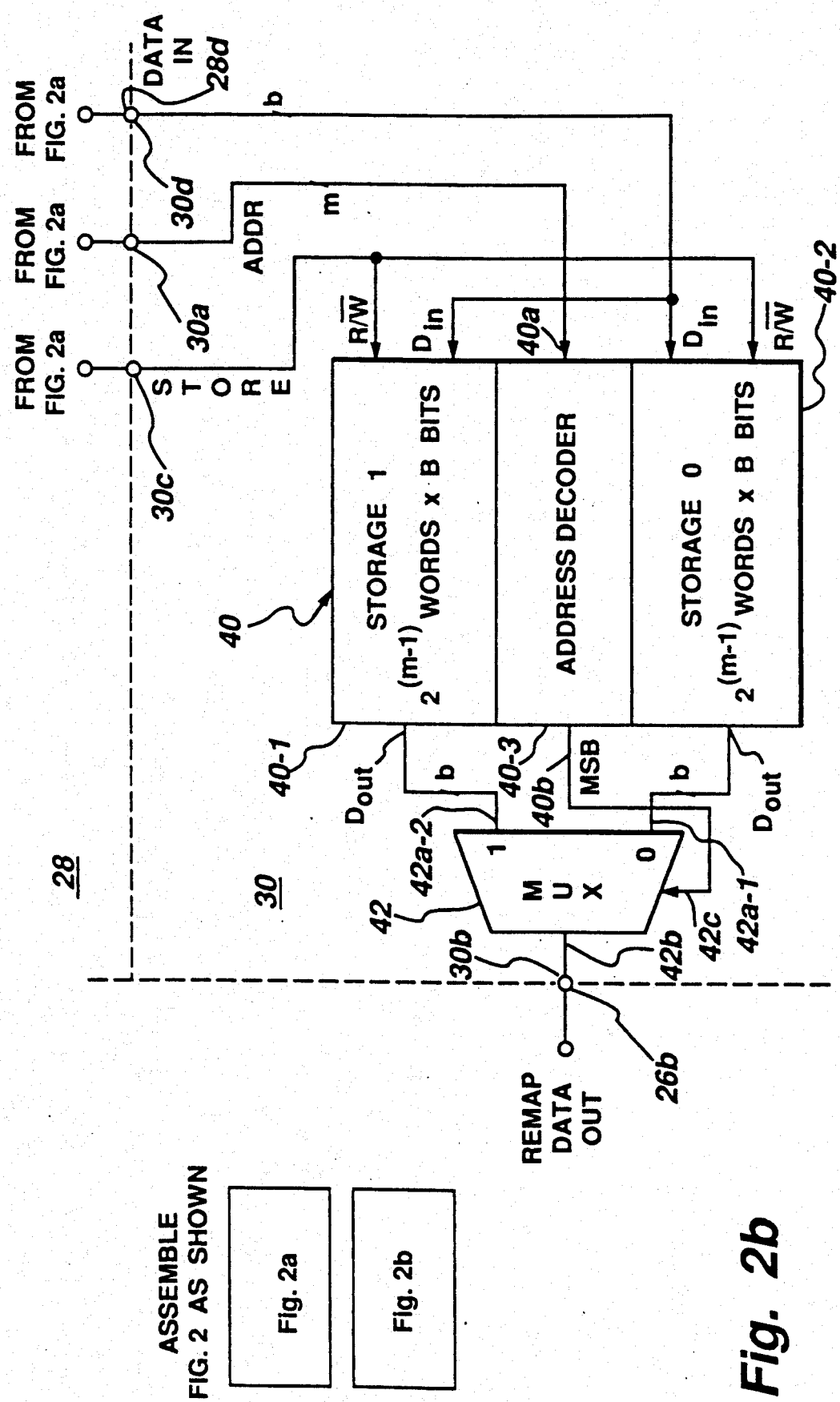

Referring now particularly to FIGS. 2a and 2b, our novel method be used with any number of different channel assemblies; here, we illustrate its use in a exemplary frontend subassembly 20 for each of the plurality N of channels in the multi-channel vibratory energy beam imaging apparatus. The analog RF (ultrasound) energy from the transducer (and from any intervening T/R (i.e. transmit 1 receive) switching means) is provided to a functional block 22, fulfilling functions such as time-gain-control amplification, compression amplification and the like of that single channel means 20 22. The processed analog signal appears a an analog input 24a of an analog-to-digital converter ADC means 24, which provides a multiple-bit-parallel output data word of m bits width at a digital data output port 24b, responsive to each occurrence of a strobe signal at a strobe input 24c. In an illustrative system, a single 7-bit flash ADC iight sample an RF signal of up to, 8 MHz at a 20 MHz sample rate. In other ones of a plethora of analog-digital systems with which our method can be used, a plurality of interleaved ADCs can be used, as can other combinations of analog-processing and conversion functions; the method of our present invention is applicable to a wide range of apparatus, as long as the apparatus provides, for each sample, a digital output data word of m bits width. The m-bit-wide data word of each sample is provided to a first input 26a of a digital remap means 26, configured in accordance with the principles of the present invention. The digital remap means 26 provides corrected and linearized digital data at an output data port 26b. A remapped (i.e. corrected) digital data word is provided at output 26b for that uncorrected digital data word then present at input 26a when one of a multiplicity of sequential clock signals is provided at a clocking input 26c; here, one edge, e.g. The following (falling) edge, of a delayed clock DLYDCLK signal (also used to provide another, earlier edge utilized for strobing ADC 24) provides the remap clock signal at input 26c. Data for storage is provided on a data bus to an input 26d of the remap means.

The digital remapping means 26 includes an input means 28 and a random-access memory (RAM) means 30, which may include static or dynamic RAM. Input means 28 includes a first multiplexer (MUX) means 31 having a zero-select first input 31a-1 receiving the m-bit-wide digital data words from the ADC output, via remap means input 26a. A one-select second input 31a-2 facilitates input of test data words from a remap means input 26e. The first MUX means output 31b provides an m-bit-wide data word selected from the data words at one of inputs 31a-1 or 31a-2 dependent on the logic level of a data bit at a MUX control input 31c, which is connected to a TEST control input 26f. Means 31 and 32 together constitute a RAM test means 33; if TEST DATA IN signal at input 26e provides a logic one, or test, value to input 31a-2, the one-selected input 31a-2 is connected to output 31b and test data from input 26f is provided to input 32a of an m-bit register means 32. Conversely, in the "normal" or "non-test" condition, a logic-zero bit is provided to input 32c, and the ADC output data word is provided through read/test word-select MUX means 31 to input 32a of the register means 32. The selected (ADC output or test data) data word at input 32a is clocked into the register and provided at a register output 32b responsive to a predetermined edge of the clock waveform at register clock input 32c; here, this selected edge would be the later (opposite) edge of the delayed clock DLYDCLK waveform having an earlier waveform edge utilized as the strobe S signal in ADC means 24. That is, in each binary clock signal cycle, the first edge causes a sample to be converted to a digital data word, and the second edge of that cycle causes the data to be read into register means 32 from ADC output 24b.

The m-bit-wide data word at register means output 32b appears at a one-select first input 34a-1 of a second multiplexer (MUX) means 34, having a zero-select second input 34a-2 connected to the output 36b of an m-bit address counter means 36. Address counter means 36 has reset input 36a which receives a reset signal from S means input 26g and receives a clock CLK signal from another input 26h. The mbits of the data word at address counter output 36b will appear at the second (load/run) MUX means output 34b if the logic state of a normal/load select signal at another SRAM means input 26i provides a logic-zero signal to the second MUX control input 34c; if a logic-one bit is provided at input 34c, the ADC 24b output data from means output 32b is provided at output 34b of MUX 34 and then to input means address ADDR output port 28a.

A data register 38 has a b-bit-wide data word input port 38a receiving b-bits of parallel data from data bus input 26d for temporary storage and for providing the data at an output port 38b, both responsive to an edge of the clock CLK signal provided from input 26h to a register clock input 38c; the storage operation is performed responsive to the later opposite edge of the clock CLK waveform from the earlier edge used to advance the count in address counter means 36. The b-bit-parallel data word is provided from data register output 38b to an input means data output port 28d.

The RAM portion 30 has an address ADDR word input port 30a and data DATA IN word input port 30d respectively providing m-bit-wide and b-bit-wide data signals to a memory means 40. In one presently preferred configuration, the actual random access memory 40 comprises first and second storage blocks 40-1 and 40-2, denominated STORAGE 0 and STORAGE 1, each having static storage for $L = 2^{(m-1)}$ words of B bits (e.g. 64 words of 10 bits each, where m=7 and B=10 in the illustrated embodiment). The two data storage blocks 40-1 and 40-2 share a common address decoder means 40-3, which decode the (m−1) lower bits of the m-bit address word into one of $2m-1$ addresses and selects that address in both blocks 40-1 and 40-2; the highest bit of the address word selects block 0 or block 1 by its logic state. Thus, the address ADDR information is simultaneously applied in parallel to the input 40a of the RAM means, while the b-bit-wide input data is supplied to data inputs $D_{in}$ of both blocks and is stored within the appropriate one of blocks 40-1 or 40-2 as selected by address decoder 40-3 (e.g. block 0 selected by MSB=0 and block 1 selected by MSB=1 where MSB is the most significant bit) responsive to a STORE (write) low-logic-level command received at the memory read/write (R/$\overline{\text{W}}$) input from a RAM means input 30c. When input 30c receives a read (high-logic-level) command, data is provided at each of the two output data $D_{out}$ ports from a location within the associated one of the two storage blocks; the selection of the internal location is dependent upon the address data word then provided at input 40a. Proper output data is present only at that one of the two storage blocks determined by the then-present value of the most significant bit (MSB) of the address data; the MSB value is carried through the decoder means 40-3 and is provided at address decoder output 40b. This MSB value is provided to the control bit 42c of a third MUX means 42, receiving the output data from one storage block 40-2 at a first, or zero-select, input 42a-1 and the output data of the other storage block 40-1 at the one select second input 42a-2. The block selected by the MSB signal provides the data at the MUX means output 42b, which is also the RAM output 30b and the remap means output port 26b.

In accordance with still another principle of the present invention, an amplitude value generator means 50 receives an enable signal 50a to provide a RF signal of known frequency and known amplitude at an output 50b. When initially enabled, the signal at output 50b has a first (typically zero) amplitude. The "amplitude", i.e. The size of the signal sampled by the ADC, is increased by a substantially fixed amount $\Delta V$ in step-wise manner whenever a next-step NEXT signal is provided at a control input 50c. The NEXT signals may be provided in a manner selected to cause each RF signal to appear at a rate commensurate with the frequency of normal operation of the channel. Thus, the amplitude of the RF signal at output 50b can be stepped from a minimum value to a maximum value in essentially equal steps of size $\Delta V$, and this step-wise analog signal can be provided, as required, to various points within the analog front-end of each channel 20. As shown, the stepped signal is provided via connection 52 to the input of compression amplifier 22, although other connections, such as via connection 52' to the ADC input and at other analog locations within each channel, can be individually programmably provided as required.

Our method thus operates with an initial loading of data in RAM 40, responsive to a logic-one pulse at reset input 26g, followed by a logic-zero load and one cycle of the clock CLK signal at input 26f for each RAM location. Thus, address counter 36 is first reset to a zero count by a logic-one pulse at input 26g and is then enabled, by input 26g returning to the logic-zero state, to up-count responsive to each pulse of the CLK signal at input 26h. The successively greater values of the address words at counter output 36b are applied via second MUX 34 (due to a logic-zero load level at control input 34c, from input 26i) to the RAM means ADDR input 30a. A selected b-bit-wide data word is provided to input 26d and is latched into register 38 on the later edge of that CLK pulse which advanced the address count, in counter means 36, on an earlier edge. The STORE bit signal at input 26j then goes to a low logic (w) level to enable writing of data into RAM 40 and the data word at input port 30d is stored at the RAM location having the address then present at ADDR port 30a. The CLK signal is cycled and a next-sequential address count appears at counter output 36b, and at port 30a. Responsive to each new address word, the STORE level is cycled to cause a new data word from input 26d (as temporarily stored within the data register 38, and provided at the output 38b thereof) to be then stored in RAM means 40.

The storage of mapping data in digital remap means 26 may be tested by applying a desired (random, successive or other selected) sequence of values of m-bit data words to test data input 26e, while the test input 26f is at a logic one value; one cycle of the DLYDCLK clock signal is then provided at input 26c, to cause the present to be entered into register 32. The signal at RUN/LOAD input 26i is is now a logic-one (run) level, so that the last, address word at register output 32b passes through second MUX34 (from input 34a-1 to output 34b) and is applied to address decoder 40-3. The STORE signal at input 30c is kept at a high logic (READ) level. The data word stored at the test address appears at remap means output 26b, allowing verification of its value against the data value originally applied at input 26d for that address.

Having tested the digital remap means storage capability, the actual input/output function for the particular channel can now be mapped into means 26. Amplitude value generator 50 is enabled and the initial (e.g. zero) RF amplitude is applied to the channel input, and is converted to a digital data word. Responsive to a logic-zero (RUN) level at input 26e, the ADC output data word appears at register 32 and is stored therein when first MUX means 31 responds to the proper (e.g. falling) DLYDCLK signal edge. As the logic signal at input 26i is now high (in the RUN state), this digital word passes through the second MUX means to appear at ADDR terminals 28a/30a and RAM address decoder input 40a. Simultaneously, new first-value data are provided at data bus input 26d (corresponding to the desired output value for the first value of RF signal amplitude at generator output 50b); these data are latched into register 38 when the CLK signal (at input 26h) cycles, and then into storage means 40 when the signal at input 26j cycles. The next-increment input 50c of the generator means 50 is enabled and the next amplitude applied in the analog portion of the channel, to provide a new ADC means output word which provides the next address at which is stored a data word, provided at input 26d, commensurate with the desired output signal for the step at which generator 50 is then providing its RF output signal. These new data are likewise stored at a unique location determined by the address then present RAM means 40, which present address is the present digital data w output from the ADC means. In this manner, the entire range of amplitude values are generated and the associated individual addresses are utilized to map the associated single data word of true data into storage means 40, so that a linear analog RF input/digital data word output set of values is stored. After calibration in this manner, the memory can be probed by external means, such as a microcomputer and the like, to search for any missing codes. If missing codes are generated in calibration, these memory locations can be written externally, using an interpolated value determined by data in the vicinity of the missing data code.

The channel can now be operated in normal-run manner by latching the signal at input 26j to the high (READ) level; the signal at input 26f is low and the signal at input 26i is high. The output data is then dependent upon, and is a predetermined function of, the analog input signal in that channel.

While several presently preferred embodiments of our novel invention have been described in detail herein, many modifications and variations will now become apparent to those skilled in the art. It is in therefore, to be limited only by the scope of the appended claims and not by the specific details and instrumentalities presented by way of explanation herein.

What we claim is:

1. A method of correcting errors in at least a selected one of a plurality N of channels of a vibratory energy imaging system, each of said channels concurrently carrying a separate, respective signal, comprising the steps of:
   (a) providing an addressable memory means having a plurality L of individually-addressable locations, each for storage of a digital data word;
   (b) storing in each of the L locations of the memory means a digital data word having a value selected to impart to a transfer function for said one of said N channels a desired functional relationship that is error-free;
   (c) converting an analog input signal in said one channel into a digital data signal in a manner causing potential error to be present in the desired relationship; and
   (d) addressing, response to each digital data output signal from the converting means, a preselected corresponding memory means location from which to output a stored digital data word, for subsequent use in said one channel, such that the outputted stored digital data word is independent of any error present in said desired relationship.

2. The method of claim 1, wherein asep (b) includes the step of selecting the transfer function to be a channel input-to-output transfer function.

3. The method of claim 2, wherein the desired functional relationship is selected to be a function linerizing said one channel digital data output with respect to a selected characteristic of an analog signal in said one channel.

4. The method of claim 1, further including the step of testing the stored digital data to ascertain that the correct data has been stored at the proper memory means location.

5. The method of claim 4, wherein the testing step includes the steps of: randomly addressing at least a portion of the total memory means locations; and comparing the data from the addressed location with the data originally sent to that location to determine if proper data is available from the addressed location.

6. The method of claim 4, wherein the testing step includes the steps of: sequentially addressing at least a portion of the total memory means locations; and comparing the data from the addressed location with the data originally sent to that location to determine if proper data is available from the memory means.

7. The method of claim 1, wherein steps (a)-(d) are separately carried out in each individual one of all of the plurality N of channels.

8. The method of claim 2, wherein the desired functional relationship is selected to be a function linearizing said one channel digital data output with respect to amplitude of an analog signal in said channel.

* * * * *